United States Patent [19]
Kapp-Schwoerer et al.

[11] Patent Number: 5,567,237
[45] Date of Patent: Oct. 22, 1996

[54] CONTINUOUS DRIER FOR BOARD-SHAPED PIECE MATERIAL AND COATING INSTALLATION COMPRISING SUCH A CONTINUOUS DRIER

[75] Inventors: Diethard Kapp-Schwoerer, Inzlingen; Rainer Krauss, Flein, both of Germany

[73] Assignee: Ciba-Geigy Corporation, Tarrytown, N.Y.

[21] Appl. No.: 259,641

[22] Filed: Jun. 14, 1994

[30] Foreign Application Priority Data

Jun. 22, 1993 [CH] Switzerland .................... 1868/93

[51] Int. Cl.⁶ .................................................... B05C 11/00
[52] U.S. Cl. .................... 118/58; 118/50.1; 118/64; 118/68; 118/244; 118/249; 118/643; 118/724
[58] Field of Search ............................ 118/50.1, 58, 64, 118/68, 643, 724, 244, 249

[56] References Cited

U.S. PATENT DOCUMENTS

| | | | |
|---|---|---|---|
| 1,560,589 | 11/1925 | Andrews et al. | |
| 2,391,195 | 12/1945 | Ross et al. | 34/17 |
| 5,044,542 | 9/1991 | Deambrosio | 118/421 |
| 5,230,165 | 7/1993 | Beisswanger | 34/60 |
| 5,288,526 | 2/1994 | Hogan et al. | 118/643 |

FOREIGN PATENT DOCUMENTS

| | | |
|---|---|---|
| 0437272 | 7/1991 | European Pat. Off. |
| 0507218 | 10/1992 | European Pat. Off. |
| 1031264 | 6/1958 | Germany |
| 1805162 | 3/1970 | Germany |
| 849403 | 9/1960 | United Kingdom |
| 1115794 | 5/1968 | United Kingdom |

*Primary Examiner*—Timothy McMahon
*Attorney, Agent, or Firm*—William A. Teoli, Jr.; David R. Crichton

[57] ABSTRACT

A continuous drier for board-shaped piece material, especially for coated in-layers or printed circuit boards, is described which comprises a drying chamber, in which the board-shaped piece material to be dried is exposed to a guided air stream while being transported in a transport plane along a transport path from an entrance to an exit of the drying chamber by transport means acting preferably at its longitudinal edges. The drying chamber is equipped with an inlet for incoming air and with an outlet for outgoing air. Arranged above and below the transport path of the board-shaped piece material are infrared radiators the radiation of which acts directly on the coated piece material and which, in addition, form a heat source for the guided air stream. The air stream in the drying chamber is guided counter to the transport direction of the board-shaped piece material and substantially parallel to the transport plane. A coating installation comprising such a continuous drier is also described. (FIG. 1)

16 Claims, 2 Drawing Sheets

CONTINUOUS DRIER FOR BOARD-SHAPED PIECE MATERIAL AND COATING INSTALLATION COMPRISING SUCH A CONTINUOUS DRIER

The invention relates to a continuous drier for board-shaped piece material, especially for in-layers or printed circuit boards. The invention relates also to a coating installation comprising such a continuous drier.

BACKGROUND OF THE INVENTION

To produce the conductors on printed circuit boards or, in the case of multi-layered printed circuit boards, on the so-called in-layers, the normally copper-clad epoxy resin glass fibre fabrics are coated with a photoresist or with a similar photo-sensitive and developable polymer layer. The desired structure of conductors is exposed on the dried coating, and the coating is developed at the exposed (or, depending upon the type of photoresist, the unexposed) places. In the etching process which follows, the copper is etched away at the uncovered places, whereas the coated places are protected from the etching effect. When the remainder of the coating has been dissolved away, the in-layer or printed circuit board having the desired structure of conductors is obtained.

The coating and the drying of the in-layers or printed circuit boards are carried out in a coating installation. The latter usually comprises a coating station, in which the in-layers or printed circuit boards are coated on one or both sides with photoresist or the like, and at least one drying station, in which the photoresist is dried and solvent (which may also be water) that evaporates off in the process is transported away from the in-layer or printed circuit board to the outgoing air.

In order to obtain the desired throughput, the in-layers or printed circuit boards have to be dried in a relatively short time. For that purpose, the drying stations are usually in the form of continuous driers in which the coated board-shaped piece material is dried during its transport from an entry opening to an exit opening. The coating is normally dried in a stream of hot air which is passed over the surface of the board. There are also continuous driers in which the coating is dried by means of infrared radiation (IR radiation). As a rule, circulating driers are arranged upstream of those infrared driers in order to evaporate off and transport away any solvent present in the coating. That preliminary drying is absolutely essential in the case of conventional infrared driers on safety grounds since, without it, the solvent vapours which would not be evaporated out and off until the infrared drier was reached could ignite upon contact with the hot surface of the infrared radiators.

An important factor determining the duration of the drying of the coating is the temperature inside the continuous drier. It cannot be set to an arbitrarily high level since that would involve the risk of the solvent vapours' igniting. When infrared driers are used, there is the risk that the coating will form bubbles (boiling bubbles), which severely impairs the evenness and the quality of the coating and may result in an in-layer or a printed circuit board coated in that manner becoming unusable. There are, therefore, limits to shortening the throughput times in conventional known continuous driers.

A further problem with known coating installations and, in particular, also with known conventional driers is the release of solvent vapours into the surroundings. These are able to leave through the entry openings and the exit openings of the individual stations, and adversely affect the surroundings. Just as solvent vapours are released through the entry and exit openings of the stations, however, so it is also possible in the case of known coating installations for contaminants to enter the installation. Those contaminants may settle on the coating and crucially impair the quality thereof. For example, particles in the coating may act as scattering centres in the exposure step or may even mask individual areas with the result that the specified structure of conductors is not completely imaged onto the photoresist. In the processing steps which follow, the copper-clad layer is then etched imperfectly and an unusable printed circuit board is produced.

OBJECTS OF THE INVENTION

It is therefore an object of the present invention to remedy the above-described shortcomings of the state of the art. A continuous drier is to be provided that permits a rapid throughput, that is to say rapid drying, of the in-layers or printed circuit boards without at the same time impairing the quality of the coating. The continuous drier is to satisfy the requirements with regard to explosion protection, and ignition of the solvent evaporated out and off during the drying process is to be avoided. In addition, with the drier, the undesirable release of solvent vapours into the surroundings is to be substantially avoided. The design of the drier is to make it possible to provide a coating installation that is substantially closed off from the surroundings. The coating installation is to make it possible to achieve relatively high clean-room qualities inside the installation, and undesirable emissions to the outside are to be substantially prevented. The drier and the coating installation are to be capable of being operated in an energy-saving manner. In addition, both the continuous drier and the coating installation are to be compact in their dimensions and inexpensive in design and in operation.

All of the above and still further objects are solved by a continuous drier for board-shaped piece material, especially for coated in-layers or printed circuit boards, which comprises a drying chamber, in which the board-shaped piece material to be dried is exposed to a guided air stream while being transported along a transport path from an entrance to an exit of the drying chamber by transport means acting preferably at its longitudinal edges. The drying chamber is equipped with an inlet for incoming air and with an outlet for outgoing air. Arranged above and below the transport path of the board-shaped piece material are infrared radiators the radiation of which acts directly on the coated piece material and which form, in addition, a heat source for the guided air stream. The air stream in the drying chamber is guided counter to the transport direction of the board-shaped piece material and substantially parallel to the transport plane. The coating installation according to the invention is equipped with such a continuous drier. The dependent patent claims each relate to especially preferred and advantageous embodiments.

BRIEF SUMMARY OF THE DRAWINGS

An example embodiment of the invention is described in detail below with reference to the schematic drawings and graphs, in which.

DETAILED DESCRIPTION OF PREFERRED EMBODIMENTS OF THE INVENTION

Figure 1:
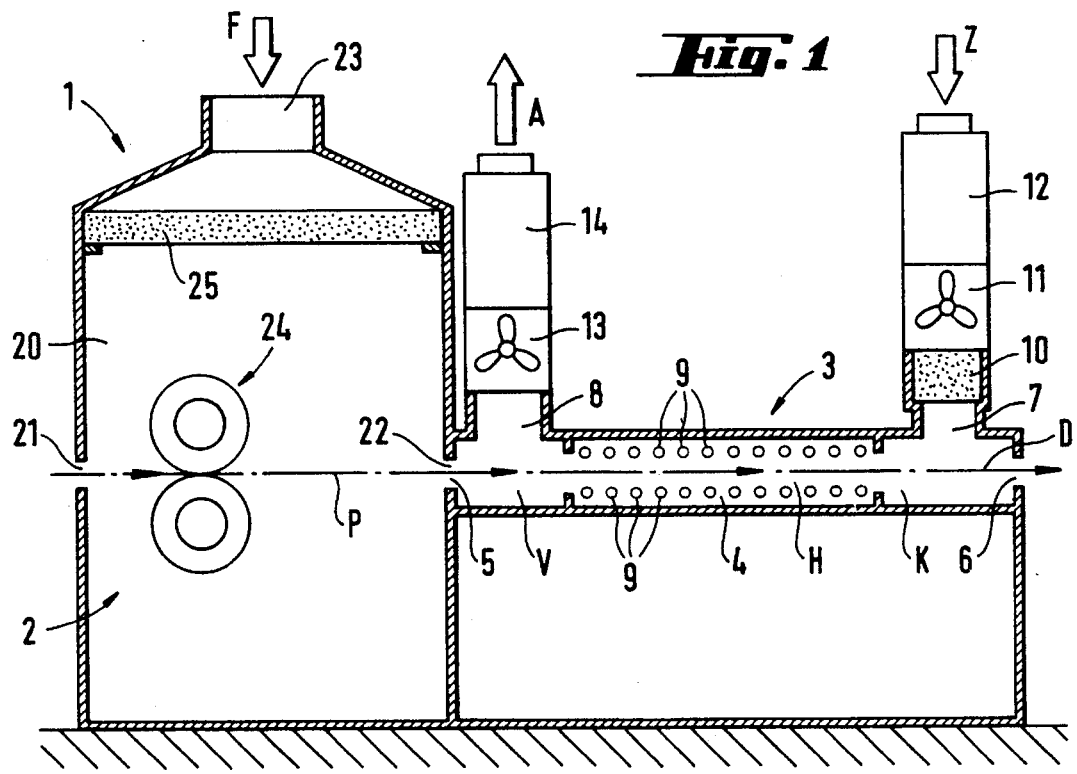
FIG. 1 shows a coating installation comprising a coating station and a continuous drier.
Figure 2:
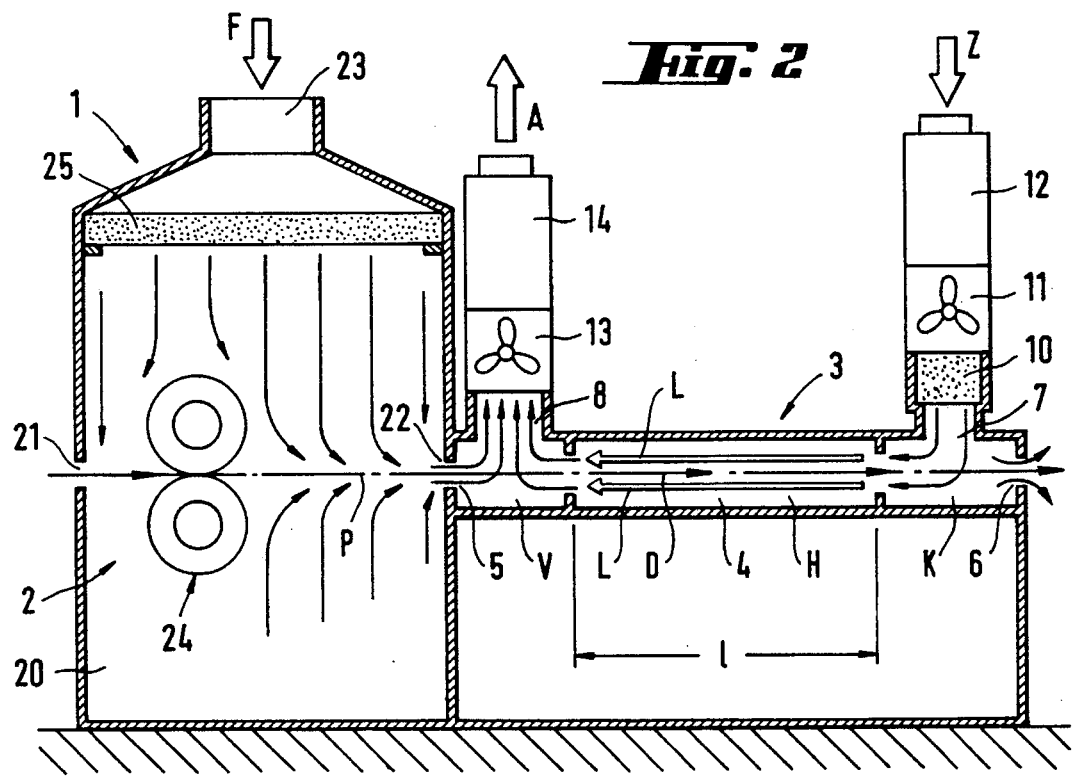
FIG. 2 shows the air flow in the coating station shown in FIG. 1, and FIGS. 3a–c show an arrangement of 3 heating zones in the continuous drier (a), the associated graph of the temperature of the infrared radiators in the heating zones (b), and the associated graph of the temperature of the convection current in the three heating zones (c).

An example embodiment of a coating installation according to the invention for board-shaped piece material, especially for in-layers or printed circuit boards, is provided overall with the reference numeral 1 in FIGS. 1 and 2. It comprises a coating station 2, in which the board-shaped piece material is coated with photoresist or the like, and a drying station 3, in which the coated piece material is dried. The drying station is, in particular, a horizontal continuous drier having a drying chamber 4 through which the coated piece material passes in a lying position along a substantially horizontal transport path P, in the direction of transport D, from an entrance 5 to an exit 6. For transporting the coated piece material the continuous drier 3 is equipped with transport means, not shown, of a kind known per se. For example, the latter may be holding clamps that are mounted on endlessly circulating transport chains or cables and that usually hold the coated board-shaped piece material at its longitudinal edges. An inlet 7 for incoming air Z and an outlet 8 for outgoing air A allow the circulation of an air stream L in the drying chamber.

Arranged in the drying chamber 4, above and below the transport path P of the coated board-shaped material are infrared radiators 9 which preferably extend parallel to the transport path P and transversely to the transport direction D. The number of infrared radiators 9 above the transport path P corresponds to the number below the transport path. In particular, each upper infrared radiator lies exactly opposite one lower infrared radiator. The infrared radiators 9 are preferably arranged at uniform distances from one another along the transport path P. The distance between two adjacent infrared radiators is approximately from 70 mm to 130 mm, preferably approximately 100 mm. For reasons of especially simple construction, the infrared radiators 9 are fitted to the upper and the lower boundary walls of the drying chamber 4. The transport means (not shown) for the coated piece material are arranged in such a manner that the transport path P of the board-shaped material extends approximately centrally between the upper and the lower boundary walls of the drying chamber 4. In that manner, the temperature profile in the drying chamber can be controlled very well.

The inlet 7 for the incoming air Z is arranged in the vicinity of the exit 6 from the drying chamber 4, whereas the outlet 8 for the outgoing air A is provided in the vicinity of the entrance 5 to the drying chamber 4. The incoming air Z introduced via the inlet 7 flows in the drying chamber 4 counter to the transport direction D of the coated board-shaped material. In particular, the air stream L flows in the drying chamber 4 approximately parallel to the transport path P. In that manner, the solvent evaporated out of and off from the coating as it dries is taken by the air stream away from the exit 6 of the drying chamber 4 to the entrance 5 of the drying chamber 4 and is there extracted through the outlet 8 for the outgoing air A.

In an especially preferred embodiment, the drying chamber 4 of the continuous drier 3 is divided into three regions. Directly adjoining the entrance 5 for the board-shaped material, a pre-heating and mixing region V is provided. Adjoining the latter is a heating region proper H having the infrared radiators 9. The last region is a cooling region K which extends from the end of the heating region H to the exit 6 from the drying chamber 4. The function of those three regions can be deduced merely from their names. In the pre-heating and mixing region V, the coated piece material entering via the entrance 5 is pre-heated by the air stream L coming from the heating region H. In the heating region H, the actual drying of the coating is effected, on the one hand by the direct effect of the radiation of the infrared radiators 9 and, on the other, by the heated air stream L passing over the coated surfaces. The air stream L is heated solely by the heat output of the infrared radiators 9. On leaving the heating region, the dried board-shaped piece material is cooled in the cooling region K by the incoming air introduced, which is usually maintained at ambient temperature or, if regulated, at approximately 25° C., before it is discharged through the exit 6 of the drying chamber 4.

Figure 3A:
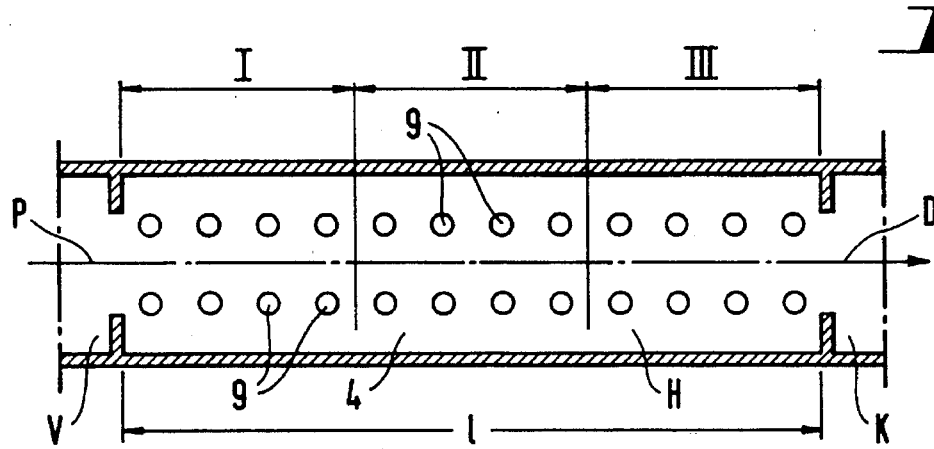
Figure 3B:
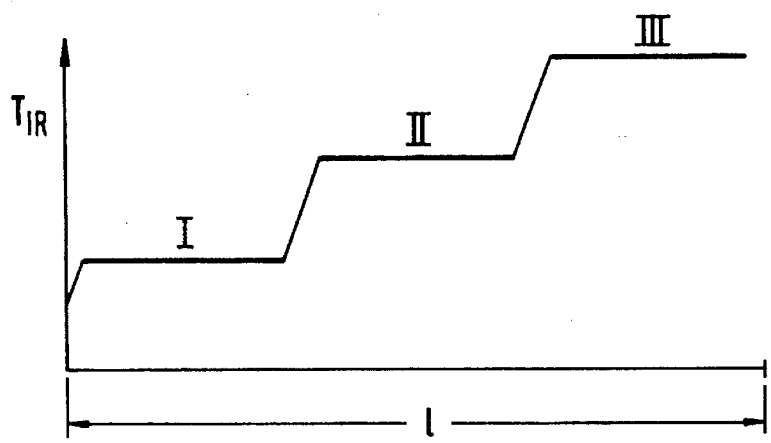

In an especially advantageous embodiment, the heating region H of the drying chamber 4 is divided into further zones in which different temperatures may be set. For that purpose, the infrared radiators 9 arranged above and below the transport path P are assembled into groups. According to the illustration in FIG. 3a, three heating zones I, II, III are formed in that manner. The infrared radiators 9 of the respective heating zones are operated at different outputs, so that they have different surface temperatures $T_{IR}$ in the heating zones I, II, III as indicated in the graph in FIG. 3b. The heating zone I having the lower surface temperature $T_{IR}$ of the infrared radiators 9 is closest to the entrance 5 to the drying chamber 4, whilst the heating zone III having the highest surface temperature $T_{IR}$ of the infrared radiators 9 lies in the vicinity of the exit 6 and adjoins the cooling region K. In the heating zone II lying between those heating zones I and III, the infrared radiators have a surface temperature $T_{IR}$ lying between that of the first heating zone I and that of the last heating zone III. When more than three heating zones are provided, the surface temperature $T_{IR}$ of the infrared radiators 9 in each successive heating zone is always greater than that in the preceding heating zone.

Figure 3C:
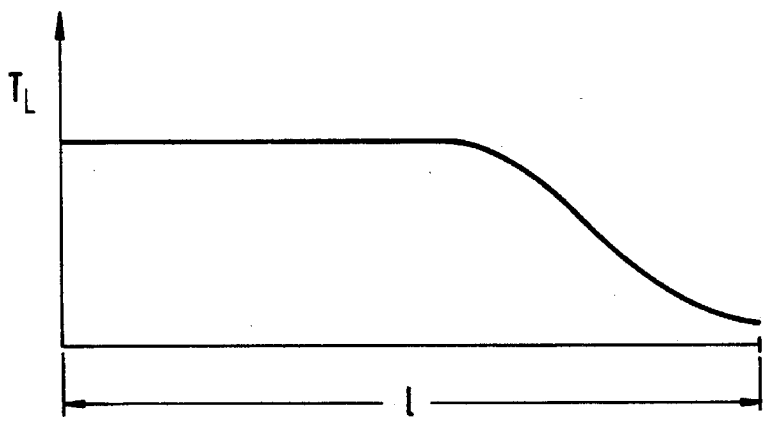

In FIG. 3c, the temperature variation $T_L$ of the air stream L over the length l of the heating region H is recorded in the form of a graph. It can clearly be seen that that variation is the opposite of the variation of the surface temperature $T_{IR}$ of the infrared radiators 9 in the individual zones I, II, III of the heating region H. The incoming air Z is introduced at approximately 25° C. As it flows through the heating region H counter to the transport direction D of the board-shaped piece material, it is heated by the infrared radiators 9. First it meets the infrared radiators 9 having the highest surface temperature and is heated by these very rapidly to the required set temperature of, for example, approximately from 110° C. to 130° C. The air stream L retains that temperature until it leaves the heating region H, since the surface temperature $T_{IR}$ of the infrared radiators 9 in the first heating zone is greater than that set temperature and is, for example, from 180° C. to 220° C.

The opposite temperature profiles of the surface temperatures $T_{IR}$ of the infrared radiators 9 and the temperature $T_L$ of the air stream L over the length l of the heating region H allow the wet-coated board-shaped piece material to be dried especially gently and, at the same time, efficiently. As the board-shaped piece material passes through the drying chamber it is pre-heated, optionally in the pre-heating and mixing chamber V first of all or, if not, when it enters the first heating zone I. In that first heating zone I, the surface temperature $T_{IR}$ of the infrared radiators 9 is relatively low, whereas the temperature $T_L$ of the air stream L leaving the heating region H has its set temperature. In that first heating zone I, a first pre-drying of the coating is effected essentially by the hot air L flowing over the surface of the board-shaped piece material. Bubble formation in the coating caused by a high radiation output of the infrared radiators 9 is reliably avoided in that manner. In the second heating zone II, drying is effected in an approximately equal proportion by the direct radiation output of the infrared radiators 9, which may, for example, have a surface temperature $T_{IR}$ of approximately from 240° C. to 260° C. in that heating zone. Finally, in the third heating zone III, final drying is effected virtually exclusively by the radiation output of the infrared radiators 9. On the other hand, the incoming air Z, which is still cold, serves to cool the board-shaped material. The third heating zone III is optionally adjoined by the cooling zone K in which no infrared radiators are arranged and the board-shaped piece material is merely exposed to the relatively cool incoming air Z.

The air flow L in the drying chamber 4 is essentially determined by how great is the amount of incoming air Z supplied and how large is the volume of outgoing air A removed. Preferably, the air outlet 8 is designed to extract a larger quantity of air than is supplied as incoming air at the inlet 7. That air ratio is preferably regulated in such a manner that the air flow L in the drying chamber 4 is substantially laminar. The laminar air flow L has the advantage that the same quantity of air flows over all regions of the surfaces of the coated board-shaped piece material to be dried and, in that manner, very uniform drying can be achieved. The laminar air flow also ensures that solvent evaporated out or off is reliably transported away from the surfaces of the piece material and is not trapped in eddy regions inside the drying chamber.

The introduction of the incoming air Z and the extraction of the outgoing air A may be effected by external transport means but, preferably, the transport means 11, 13 are respectively provided for the incoming and outgoing air in the air inlet 7 and the air outlet 8 of the drying chamber 4. In order to ensure the constancy of the quantity of incoming air Z introduced at the inlet 7 and of the quantity of outgoing air A extracted at the outlet 8, flow rate regulators 12 and 14 for the air are respectively provided at the inlet 7 and the outlet 8. In that manner, the flow ratios in the drying chamber 4 can be precisely regulated, which is very advantageous to maintaining the preferably laminar air flow L.

In order to prevent contaminants, particles, etc. from also entering the drying chamber 4 with the incoming air Z, a clean-room filter 10 is preferably fitted in the inlet 7 for the incoming air Z. The type of clean-room filter 10 depends upon the clean-room class to be achieved in the drying chamber 4.

The coating installation 1 according to the invention for board-shaped piece material, especially for in-layers or printed circuit boards, comprises a continuous drier 3 of the kind described in which the coating is dried in a gentle manner and solvent present in the coating is evaporated off and transported away. The coating station 2 of the coating installation 1 comprises a coating cabin 20 having an entry opening 21 for the board-shaped piece material to be coated. Provided on the opposite side of the coating cabin 20 is an exit opening 22 which leads directly into the entrance 5 of the drying chamber 4. Air F can be blown into the coating cabin 20 through an air inlet opening 23 preferably provided in the top cover region of the coating cabin 20.

Arranged inside the coating cabin 20 is a roller coating device 24. The latter comprises one coating roller arranged above and one coating roller arranged below the transport path P of the board-shaped piece material, between which the board-shaped piece material is transported for coating with the photoresist or the like. In that form of coating, both surfaces of the in-layers or printed circuit boards are evenly coated simultaneously. During the process, they are held at their longitudinal edges by transport means provided in the coating cabin 20. Those transport means may be of analogous construction to the transport means in the drying station 3; since they are of no further significance to the invention, their illustration in the Figures has been dispensed with.

The air F which is introduced via the air inlet opening 23 and which is usually maintained at ambient temperature or at approximately 25° C. passes through the exit opening 22 to the outlet 8 of the drying chamber 4 for the outgoing air A of the drying chamber. In that manner, the entire coating installation 1 has only one outlet 8 for the outgoing air charged with solvent vapours, which air comes, on the one hand, from the drying station 3 and, on the other hand, also from the coating station 2. The extraction power at the outlet opening 8 is regulated in such a manner that the volume of outgoing air A removed approximately corresponds to the air volumes of the air L passed through the drying chamber 4 and the air F blown into the coating cabin 20.

The mixing ratio of the air volumes of the hot air L originating from the drying chamber 4 and the cold air F from the coating cabin is selected to be such that the outgoing air A at the common outlet 8 has a temperature of approximately only from 30° C. to 70° C., whereas the temperature of the drying air in the drying chamber 4 is still approximately from 110° C. to 130° C. Consequently, special measures to protect the extracted outgoing air A charged with solvent vapours from spontaneous ignition can largely be dispensed with.

In order to keep also the coating cabin 20 free from contaminants, particles, etc., a clean-room filter 25 can be provided in the air inlet opening 23. As already mentioned in connection with the clean-room filter 10 in the inlet for the incoming air to the drying chamber, the type of clean-room filter chosen will depend upon the clean-room quality to be achieved.

The clean-room quality can be improved still further by isolating the air in the coating installation 1 from the surrounding air. For that purpose, the air is guided in the coating installation in such a manner that there is a slight over-pressure in the coating cabin 20 in the region of the entry opening 21 and in the drying chamber 4 in the region of the exit 6. That slight over-pressure prevents the surrounding air from entering the coating installation through the entry opening 21 and through the exit 6. The small quantities of the air F introduced into the coating cabin 20 and of the incoming air Z introduced into the drying chamber 4 that are released into the surroundings through the entry opening 21 and through the exit 6, respectively, are virtually free from solvent vapours. Those solvent vapours are, of course, transported, on the one hand, by the air flow in the coating cabin 20 through the exit opening 22 and, on the other hand, by the preferably laminar air flow L in the drying chamber 4 to the outlet 8 and are extracted there. In that manner, it is possible both to improve the clean-room quality in the coating installation 1 and to keep the surroundings of the coating installation 1 substantially free from solvent vapours.

The coating installation according to the invention and the continuous drier according to the invention permit a very short throughput time of the wet-coated piece material to be dried. For example, in-layers (copper-clad laminate) that have been coated with a photoresist, comprising 50% solids and methoxybutanol as solvent, in a wet film thickness of 25 µm can be dried in less than 50 seconds. The length of the drying chamber is in that case, for example, approximately from 1.6 m to 2.0 m, its width from approximately 0.9 m to approximately 1.0 m and its height approximately from 0.30 m to 0.40 m. The size of the entrance and the exit of the drying chamber is from approximately 0.92 m to approximately 0.98 m in width with a height of from approximately 0.13 m to approximately 0.18 m. The distance of the infrared radiators from the substrate is approximately from 0.12 m to 0.17 m. The infrared radiators used are, for example, STM twin-tube radiators produced by Heraeus Noblelight, which, at an output of 1200 watts, have a radiation density of approximately 12 kW/m2. The surface temperatures of the infrared radiators are, for example, approximately 200° C. in the first heating zone, approximately 250° C. in the second, and just below 300° C. in the third heating zone. The incoming air introduced into the drying chamber and into the coating cabin has, for example, a temperature of approximately 25° C. The amount of air at the inlet to the drying chamber is regulated to from approximately 200 $m^3/h$ to approximately 800 $m^3/h$, preferably approximately 500 $m^3/h$. The amount of outgoing air at the outlet is regulated to from approximately 1500 $m^3/h$ to approximately 3000 $m^3/h$, preferably approximately 2000 $m^3/h$. In that manner, an outgoing air temperature of approximately from 40° C. to 50° C. is provided at the outlet, although the temperature of the drying air in the third heating zone is still approximately 120° C. The clean-room filters are, for example, a paper-like glass fibre web which has a degree of separation for particles $\geq 0.3$ µm of more than 99.99%. In that manner, a clean-room quality of clean-room class 100, for example, can be obtained in the coating installation.

The coating installation according to the invention and especially the continuous drier according to the invention are compact in their dimensions and relatively inexpensive to manufacture and to operate. They permit a very rapid throughput of in-layers or printed circuit boards. The design of the continuous drier also takes into account requirements with regard to safety, especially explosion protection. On the one hand, the in-layers or printed circuit boards pass through a drying chamber having a rising temperature profile. At the entrance to the drying chamber, where, at the beginning of the drying process, relatively large amounts of solvent evaporate off or out, the temperature of the surface of the infrared radiators is relatively low. The highest surface temperatures are exhibited by the infrared radiators at the exit from the drying chamber, where only a small amount of solvent is still present in the coating. The flow of air in the drying chamber is counter to the transport direction of the in-layers or printed circuit boards. That ensures that the solvent vapours are transported away from the heating zones having the infrared radiators with the higher surface temperatures. As a further safety measure, care may also be taken that the surface temperature of the infrared radiators does not exceed 300° C. The hot outgoing air of the continuous drier is mixed with the cold outgoing air of the coating cabin. The temperature of the outgoing air at the outlet is thereby kept low, which further increases the safety of the installation. The continuous drier and the coating installation can be operated with a very high clean-room quality with only little energy expenditure. The ventilation concept of the continuous oven and, in particular, of the coating installation effects isolation from the surroundings and in that manner substantially prevents the release of solvent vapours into the surroundings.

What is claimed is:

1. A continuous drier for board-shaped piece material, especially for coated in-layers or printed circuit boards, comprising a drying chamber, in which the board-shaped piece material to be dried is exposed to a guided essentially laminar air stream while being transported along a transport path in a transport plane from an entrance to an exit of said drying chamber by transport means acting preferably at its longitudinal edges, further comprising an inlet and an outlet for the air, wherein there are arranged above and below said transport plane for said board-shaped piece material infrared radiators the radiation of which acts directly on said coated piece material and which, at the same time, form a heat source for said guided laminar air stream;

and wherein said laminar air stream is guided inside said drying chamber counter to the transport direction of said board-shaped piece material and substantially parallel to said transport plane;

the drying of said coated piece material is performed both by the infrared radiation of said infrared radiators directly acting on said coated piece material and by said guided laminar air stream in such a manner that near said entrance of said drying chamber the drying is mainly effected by said guided laminar air stream and near said exit of said drying chamber the drying is mainly effected by the infrared radiation of said infrared radiators directly acting on said coated piece material.

2. An apparatus according to claim 1, wherein said infrared radiators are arranged at uniform distances from one another along said transport path, the distance of two of said infrared radiators from each other being from approximately 70 mm to approximately 130 mm, preferably approximately 100 mm.

3. An apparatus according to claim 1, wherein said infrared radiators arranged along said transport path above and below the same are assembled into groups and can be operated in such a manner that said drying chamber comprises several, preferably three, heating zones along said transport path, each of said heating zones comprising a group of infrared radiators having a different surface temperature, the heating zone having infrared radiators with the lowest surface temperature being closest to said entrance of said drying chamber, whilst the heating zone having infrared radiators with the highest surface temperature is the last heating zone before said exit.

4. An apparatus according to claim 1, wherein said air outlet is designed to remove a greater quantity of air than is supplied at said air inlet.

5. An apparatus according to claim 1, wherein said inlet for the incoming air is arranged in a region of said exit of said drying chamber, whereas said outlet for the outgoing air is arranged in a region of said entrance of said drying chamber, and wherein flow rate regulators for the air are provided at said inlet and at said outlet.

6. An apparatus according to claim 5, wherein a clean-room filter is arranged in said inlet for the incoming air.

7. An apparatus according to claim 1, wherein said transport path of the board-shaped material inside said drying chamber extends substantially horizontally.

8. An apparatus according to claim 1, wherein said drying chamber is divided into three regions, a pre-heating and mixing region, which is arranged immediately downstream of said entrance, followed by a heating region, which is optionally divided into the three heating zones, and a cooling region, which is arranged before said exit of said drying chamber.

9. A coating installation for board-shaped piece material, especially for in-layers or printed circuit boards, comprising a coating station, in which the board-shaped piece material is coated on one or on both sides with photoresist, and an adjoining drying station, in which said photoresist is dried and solvent contained in said photoresist is evaporated off and transported away, wherein said drying station is a continuous drier according to claim 1.

10. A coating installation according to claim 9, wherein said coating station comprises a coating cabin having an air inlet opening and an entry opening and an opposite exit opening for said board-shaped material to be coated, said exit opening leading directly into said entrance to said drying chamber.

11. A coating installation according to claim 10, wherein said coating station is equipped with a roller coating device comprising one coating roller arranged above and one coating roller arranged below said transport path of said board-shaped piece material, between which said board-shaped piece material can be transported for coating with photoresist or the like while being held at its longitudinal edges by transport means provided in said coating station.

12. A coating installation according to claim 10, wherein said outlet opening provided in said continuous drier for the outgoing air is at the same time the air outlet opening for said coating cabin.

13. A coating installation according to claim 12, wherein a volume of outgoing air removed at said outlet opening approximately corresponds to the air volumes of said drying air that is passed through said drying chamber and the air introduced into said coating cabin.

14. A coating installation according to claim 13, wherein said air inlet opening of said coating cabin is equipped with a clean-room filter.

15. A coating installation according to claim 12, wherein a mixing ratio of hot outgoing air from said drying chamber and cold outgoing air from said coating cabin is selected to be such that the outgoing air at said outlet opening has a temperature of approximately from 30° C. to 70° C.

16. A coating installation according to claim 12, wherein said drying air is guided inside the installation in such a manner that there is a slight over-pressure inside said coating cabin in a region of said entry opening and inside said drying chamber in a region of said exit for said board-shaped piece material, so that said installation is substantially isolated from the surrounding air.

* * * * *